(12) United States Patent
Hu et al.

(10) Patent No.: US 10,128,830 B2
(45) Date of Patent: Nov. 13, 2018

(54) TRACK AND HOLD CIRCUIT

(71) Applicant: China Electronic Technology Corporation, 24th Research Institute, Chongqing (CN)

(72) Inventors: Rong-Bin Hu, Chongqing (CN); Guang-Bing Chen, Chongqing (CN); Gang-Yi Hu, Chongqing (CN); Yong-Lu Wang, Chongqing (CN); Zheng-Ping Zhang, Chongqing (CN); Can Zhu, Chongqing (CN); Rong-Ke Ye, Chongqing (CN); Lei Zhang, Chongqing (CN); Yu-Han Gao, Chongqing (CN)

(73) Assignee: CHINA ELECTRONIC TECHNOLOGY CORPORATION, 24TH RESEARCH INSTITUTE, Chongqing (CN)

( * ) Notice: Subject to any disclaimer, the term of this patent is extended or adjusted under 35 U.S.C. 154(b) by 84 days.

(21) Appl. No.: 15/318,975

(22) PCT Filed: Apr. 17, 2014

(86) PCT No.: PCT/CN2014/075549
§ 371 (c)(1),
(2) Date: Dec. 14, 2016

(87) PCT Pub. No.: WO2015/157952
PCT Pub. Date: Oct. 22, 2015

(65) Prior Publication Data
US 2017/0179940 A1    Jun. 22, 2017

(30) Foreign Application Priority Data

Apr. 14, 2014   (CN) .......................... 2014 1 0147761

(51) Int. Cl.
*G11C 27/02*       (2006.01)
*H03K 17/082*    (2006.01)

(52) U.S. Cl.
CPC ....... *H03K 17/0822* (2013.01); *G11C 27/026* (2013.01)

(58) Field of Classification Search
None
See application file for complete search history.

(56) References Cited

U.S. PATENT DOCUMENTS 4,833,345 A * 5/1989 Miller .................. G11C 27/026
                                                                327/307
6,031,398 A * 2/2000 Karanicolas ......... G11C 27/024
                                                                327/91
(Continued)

FOREIGN PATENT DOCUMENTS

CN       1381058 A      11/2002
CN       1868004 A      11/2006
(Continued)

*Primary Examiner* — Lincoln Donovan
*Assistant Examiner* — Khareem E Almo
(74) *Attorney, Agent, or Firm* — Cheng-Ju Chiang

(57) ABSTRACT

A track and hold circuit comprises an input buffer amplifier, a unit gain amplifier module, a sampling switch, a drive triode and a sampling capacitor. The input buffer amplifier receives an input signal. In a track phase, the sampling switch is electrically connected to an emitter electrode of the drive triode; the input signal charges the sampling capacitor after being buffered by the input buffer amplifier, amplified without distortion by the unit gain amplifier module and driven by the drive triode. In a hold phase, the sampling switch is electrically connected to a base electrode of the drive triode; the base voltage of the drive triode is pulled down until the drive triode is cut off; electrical charges on (Continued)

the sampling capacitor are thereby held, causing the signal to be held on the sampling capacitor.

9 Claims, 5 Drawing Sheets

(56) References Cited

U.S. PATENT DOCUMENTS

| | | | | |
|---|---|---|---|---|
| 7,635,996 | B2* | 12/2009 | Morisson | G11C 27/026 327/91 |
| 8,344,795 | B2* | 1/2013 | Sanduleanu | H03H 11/1252 327/552 |
| 2006/0145729 | A1* | 7/2006 | Luh | G11C 27/026 327/94 |
| 2009/0040796 | A1* | 2/2009 | Lalithambika | H02M 3/33507 363/21.17 |
| 2011/0210764 | A1* | 9/2011 | Hoskins | G11C 27/026 327/96 |
| 2016/0104543 | A1* | 4/2016 | Powell | G11C 27/026 327/96 |
| 2017/0179940 | A1* | 6/2017 | Hu | H03K 17/0822 |

FOREIGN PATENT DOCUMENTS

| | | | |
|---|---|---|---|
| CN | 101197193 | A | 6/2008 |
| CN | 101647071 | A | 2/2010 |
| CN | 101986570 | A | 3/2011 |
| JP | 2010187355 | A | 8/2010 |
| WO | 2010032727 | A1 | 3/2010 |

* cited by examiner

TRACK AND HOLD CIRCUIT

CROSS REFERENCE TO RELATED APPLICATIONS

The present application is a 35 U.S.C. § 371 National Phase conversion of International (PCT) Patent Application No. PCT/CN2014/075549, filed on Apr. 17, 2014, which claims benefit of Chinese Patent Application No. 201410147761.X, filed on Apr. 14, 2014, the disclosure of which is incorporated by reference herein. The PCT International Patent Application was filed and published in Chinese.

BACKGROUND OF THE INVENTION

1. Field of the Invention

The present invention relates to a track and hold sampling circuit.

2. Background Art

A traditional track and hold circuit generally comprises an input buffer circuit, a current switch, a drive transistor and a sampling capacitor. As a traditional track and hold circuit stays in holding phase, sampling signals of upper electrode plate and input signals are isolated by OFF-state drive transistor, resulting to an undesirably strong sample-and-hold coupling in sample capacitors and input signals. In addition, in hold phase, the drive transistor in a sampling switch starts to work in a linear region, in a way that greatly reduces switching speed of the current switch.

BRIEF SUMMARY OF THE INVENTION

To solve the problem mentioned above, a track and hold circuit is provided featuring favorable signal isolation and high speed switch.

A track and hold circuit comprises an input buffer amplifier, a unit gain amplifier module, a sampling switch, a drive triode and a sampling capacitor, wherein, the input buffer amplifier receives an input signal; the sampling switch is In track phase, the sampling switch is connected to the emitter of the drive triode; the input signal is buffered through the input buffer amplifier and amplified without distortion by the unit gain amplifier module; the drive triode is used to charge the sampling capacitor; as the sampling switch is switched from track phase to hold phase, the sampling switch is disconnected to the emitter of the drive triode, the base of the sampling switch and the base of the drive triode are connected, so that the base voltage of the drive triode is leveled down till the drive triode being cut off. Then the charges at the sampling capacitor are sustained in ways that hold signals at the sampling capacitor.

Preferably, the input buffer amplifier receives, amplifies and outputs input signals. The unit gain amplifier module comprises a first triode, a second triode, a first current source and a second current source. The base of the first triode is connected to the output end of the input buffer amplifier to receive the amplified input signals. The collector of the first triode receives a direct current (DC) voltage. The emitter of the first triode is connected to the emitter of the second triode as a differential pair circuit. The emitter of the first triode is connected to the emitter of the second triode being grounded through the second current source. The base of the second triode is connected to the collector of the second triode as a feedback circuit. The collector of the second triode receives the DC voltage via the first current source.

Preferably, the first current source provides load currents for the second triode and the second current source provides tail current for the differential pair circuit.

Preferably, the first triode and the second triode are both NPN-type bipolar triodes.

Preferably, the current provided by the second current source is two times of the current provided by the first current source.

Preferably, the track and hold circuit comprises a third current source. The sampling switch comprises a first end, a second end and a third end. The first end of the sampling switch is connected to the ground via the third current source. The second end of the sampling switch is connected to bases of the second triode and the drive triode respectively. The third end of the sampling switch is connected to the emitter of the drive triode. The emitter of the drive triode is connected to the ground via the sampling capacitor. The collector of the drive triode receives the DC voltage.

Preferably, the track and hold circuit features an overdrive protection module, wherein, the overdrive protection module comprises a field effect transistor, a fourth current source and a third triode. The gate of the field effect transistor is connected to the emitter of the drive triode. The source of the field effect transistor receives the DC voltage via the fourth current source. The drain of the field effect transistor is grounded. The base of the third triode is connected to the source of the field effect transistor. The emitter of the third triode is connected to the base of the drive triode. And the collector of the third triode receives the DC voltage.

Preferably, the field effect transistor is a P-channel field effect transistor and the third triode is an NPN triode.

Preferably, the field effect transistor and the fourth current source works as a source follower circuit, wherein the input end of the source follower circuit is connected to the upper plate of the sampling capacitor, the output end of the source follower circuit is connected to the base of the third triode.

Preferably, the third triode keeps cut-off status during the sample-and-track phase and the third triode keeps ON-state during the sample-and-hold phase.

Compared with the prior art, when the track and hold circuit stays in a track phase, the sampling switch is connected to the emitter of the drive triode; the input signal is buffered through the input buffer amplifier and amplified without distortion by the unit gain amplifier module; the drive triode is used to charge the sampling capacitor; as the sampling switch is switched from track phase to hold phase, the sampling switch is disconnected to the emitter of the drive triode, the base of the sampling switch and the base of the drive triode are connected, so that the base voltage of the drive triode is leveled down till the drive triode being cut off. Then the charges at the sampling capacitor are sustained in ways that hold signals at the sampling capacitor. As the overdrive protection circuit is used to prevent the triode in the sampling switch from entering a deep saturation area, the sampling frequency increases. Meanwhile, multi-polar isolation technology is adopted to prevent interference between input signals and sampling signals.

DETAILED DESCRIPTION OF THE INVENTION

Accompanying with the following drawings, the referred embodiments are provided to describe, not to limit, technical approaches in the present invention. Obviously, bearing the essence and concept of the present invention, technologists in this field can make carious changes and modifications to the present invention. It should be understood that those changes and modifications are also covered by claims of the present invention, if they are with the same purpose and within the same scope of the present invention.

It should be understood that such terms as first, second, etc. are used for only denoting devices but not to limiting the devices. For instance, the contents hereafter may refer first to denote one device, or otherwise, refer second to denote the same device. Notice that when the phrase of "being connected to" is used hereinafter, it means either the two devices being connected or being connected to another device in between. Otherwise, when the phrase of "being directly connected to" is used hereinafter, it only means being connected without any device in between.

The terms being used hereinafter are used to describe the referred embodiment but not to limit the invention. Unless being noted in contents, the use of singular or plural nouns shall not limit the invention.

It should be understood that the use of "comprise" shall not limit the invention about describing or listing features and characteristics of the circuit. There may exist other features and characteristics of the circuit which has not been covered or listed in the invention.

Figure 1:
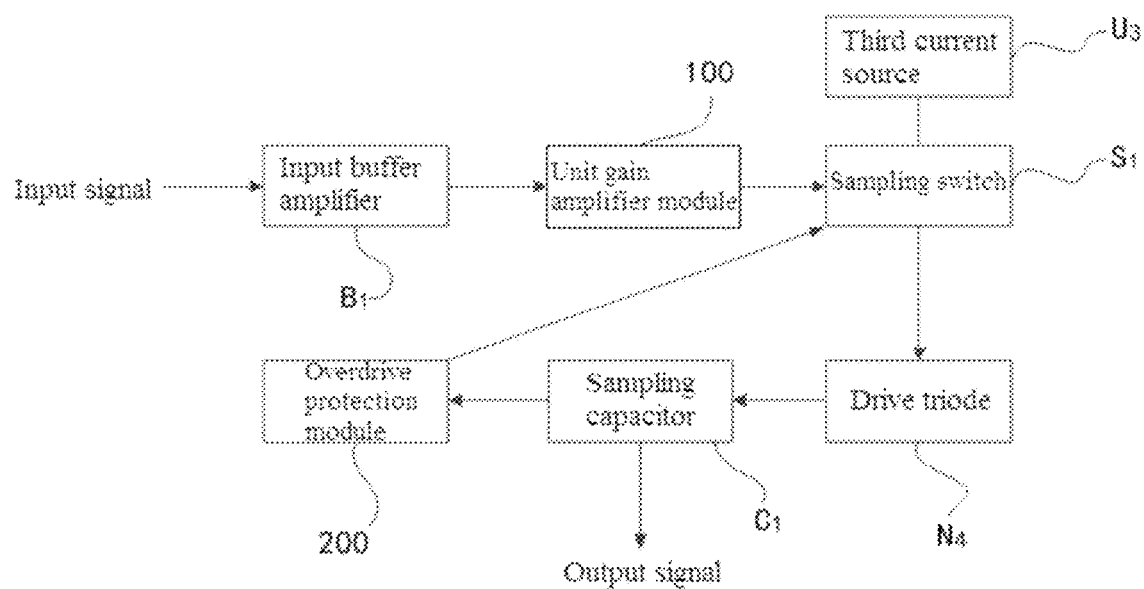
FIG. 1 is a block diagram of a track and hold circuit of the present invention.

As shown in FIG. 1, the first preferred embodiment of the track and hold circuit of the present invention comprises an input buffer amplifier $B_1$, a unit gain amplifier module 100, and an overdrive protection module 200.

Figure 2:
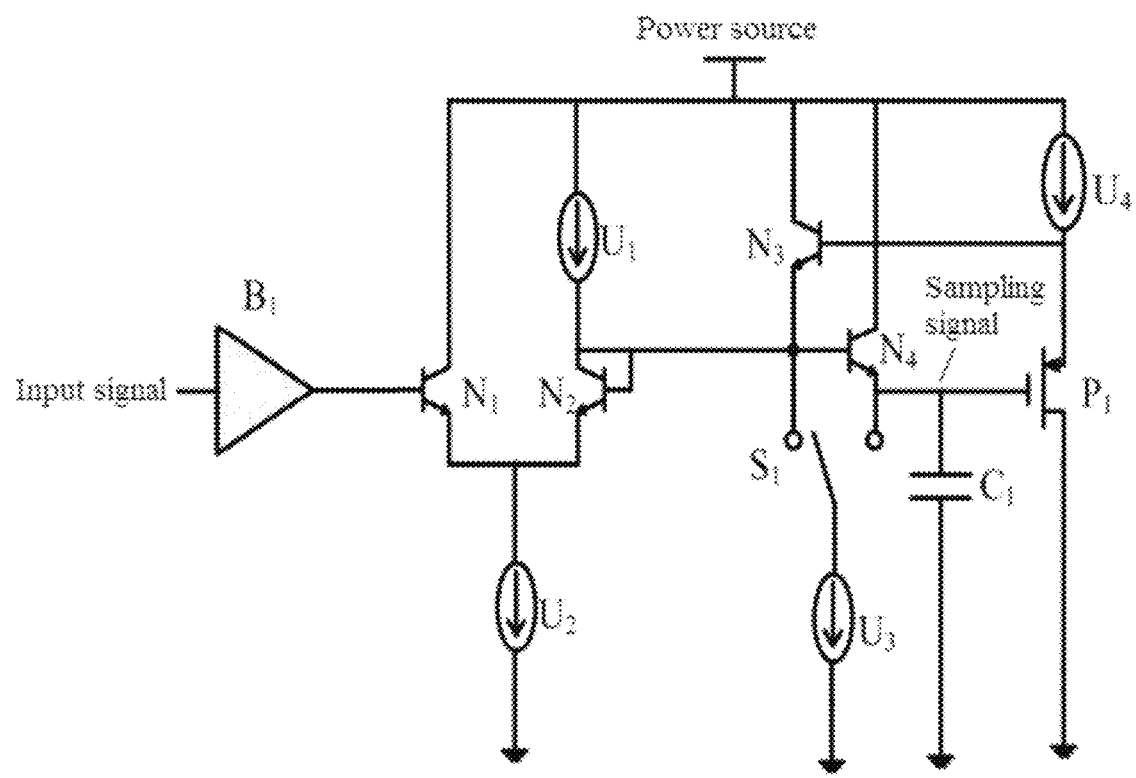
FIG. 2 is a circuit diagram of the first preferred embodiment of the track and hold circuit as shown in FIG. 1.

As shown in FIG. 2, the input end of the input buffer amplifier $B_1$ receives an input signal. The input buffer amplifier $B_1$ work to receive, amplify and output input signals. The unit gain amplifier module 100 comprises a first triode $N_1$, a second triode $N_2$, a first current source $U_1$ and a second current source $U_2$. The base of the first triode $N_1$ is connected to the output end of the input buffer amplifier $B_1$ to receive the amplified input signal. The collector of the first triode $N_1$ receives a DC voltage Vcc. The emitter of the first triode $N_1$ is connected to the emitter of the second triode $N_2$ as a differential pair circuit. The emitter of the first triode $N_1$ and the emitter of the second triode $N_2$ are connected and grounded via the second current source $U_2$. The second current source $U_2$ works to provide tail currents for the differential pair circuit. The base of the second triode $N_2$ is connected to the collector of the second triode $N_2$ as a feedback circuit. The collector of the second triode $N_2$ receives the DC voltage Vcc via the first current source $U_1$. The first current source $U_1$ provides load currents for the second triode $N_2$.

Wherein, the first triode $N_1$ and the second triode $N_2$ are both NPN-type bipolar triodes. To attain the best performance of the feedback circuit, the current provided by the second current source $U_2$ is two times of that provided by the first current source $U_1$.

The track and hold circuit also comprises a sampling switch $S_1$, a third current source $U_3$, a drive triode $N_4$ and a sampling capacitor $C_1$. The sampling switch $S_1$ comprises a first end, a second end and a third end. The first end of the sampling switch is grounded via the third current source $U_3$. The second end of the sampling switch $S_1$ is connected to the bases of the second triode $N_2$ and the drive triode $N_4$. The third end of the sampling switch $S_1$ is connected to the emitter of the drive triode $N_4$. The emitter of the drive triode $N_4$ is grounded via the sampling capacitor $C_1$. The collector of the drive triode $N_4$ receives the DC voltage Vcc.

The overdrive protection module 200 comprises a field effect transistor $P_1$, a fourth current source $U_4$ and a third triode $N_3$. The gate of the field effect transistor $P_1$ is connected to the emitter of the drive triode $N_4$. The source of the field effect transistor $P_1$ receives the DC voltage Vcc via the fourth current source $U_4$. The drain of the field effect transistor $P_1$ is connected to the ground. The base of the third triode $N_3$ is connected to the source of the field effect transistor $P_1$. The emitter of the third triode $N_3$ is connected to the base of the drive triode $N_4$. The collector of the third triode $N_3$ receives the DC voltage Vcc.

Wherein, the field effect transistor $P_1$ is a P-channel field effect transistor. The third triode $N_3$ is an NPN-type triode. The field effect transistor $P_1$ and the fourth current source $U_4$ constitute a source follower circuit. The input end of the source follower circuit is connected to the upper plate of the sampling capacitor $C_1$. The output end of the source follower circuit is connected to the base of the third triode $N_3$. The third triode $N_3$ stays OFF-state during the sample-and-track phase, being independent from the sample circuit. The third triode $N_3$ stays ON-state during the sample-and-hold phase in a way that prevents transistors of the sampling switch from entering a deep saturation area. So the switching speed of the transistor and the sampling frequency of sampling circuit won't be affected.

Wherein, the sampling switch $S_1$ is controlled by a clock signal. When the clock signal is a high level, the first end of the sampling switch is connected to its second one, so the first end of the sampling switch $S_1$ is connected to the base of the drive triode $N_4$. When the clock signal is a low level, the first end of the sampling switch $S_1$ is connected to its third one, which makes the first end of the sampling switch $S_1$ be connected to the emitter of the drive triode $N_4$.

The sampling circuit works in a cycle of track phase and hold phase. In the track phase, the first end of the sampling switch $S_1$ is connected to the emitter of the drive triode $N_4$. The drive triode $N_4$ and the third current source $U_3$ constitute an emitter follower circuit. The input signal is buffered by the buffer amplifier $B_1$ and amplified without distortion by the unit gain amplifier module 100 and driven by the emitter follower circuit in ways that charge the sampling capacitor $C_1$. Therefore, the base-emitter junction voltage of the third triode is expressed as equation (1)

$$V_{be3} = |V_{GS}| - V_{be4} \qquad (1)$$

As mentioned in equation (1), $V_{be4}$ is the base-emitter junction voltage of the drive triode $N_4$ and $V_{GS}$ is the gate-source voltage of the field effect transistor $P_1$. As $|V_{GS}|$ is very close to $V_{be4}$, so $V_{be3}$ is approximately equal to 0. It shows that the third triode $N_3$ stays OFF state during the track phase, so it has no effect on the sampling circuit.

As the sampling switch $S_1$ shifts from the track phase to the hold phase, the first end of the sampling switch $S_1$ is disconnected to the emitter of the drive triode $N_4$ and the first end of the sampling switch $S_1$ is connected to the base of the drive triode $N_4$ The current of the third current source $U_3$ is generally designed much larger than the current of the second current source $U_2$, which makes the base voltage of the drive triode $N_4$ be pulled down till the drive triode $N_4$ is cut off. At this time, charges in the sampling capacitor $C_1$ will be held so that signals are held in the sampling capacitor $C_1$. Meanwhile, as the base potential of the drive triode $N_4$ is pulled down, the second triode $N_2$ is in OFF state, preventing the sampling signal from being interfered by input signals. The base voltage of the drive triode $N_4$ is further pulled down till the third triode $N_3$ is ON. The third triode $N_3$ features sufficient currents $I_3$ being expressed as equation (2)

$$I_3 = I_2 + I_{e3} \qquad (2)$$

As mentioned in equation (2), $I_3$ is the current provided by the third current source $U_3$, $I_2$ is the current provided by the second current source $U_2$, and $I_{e3}$ is the current provided by the third triode $N_3$. The third triode $N_3$ is on in case that the base voltage of the drive triode $N_4$ can be further pulled down and transistors of the sampling switch $S_1$ enter into the deep saturation area. So the rate of the sampling circuit is improved.

Figure 3:
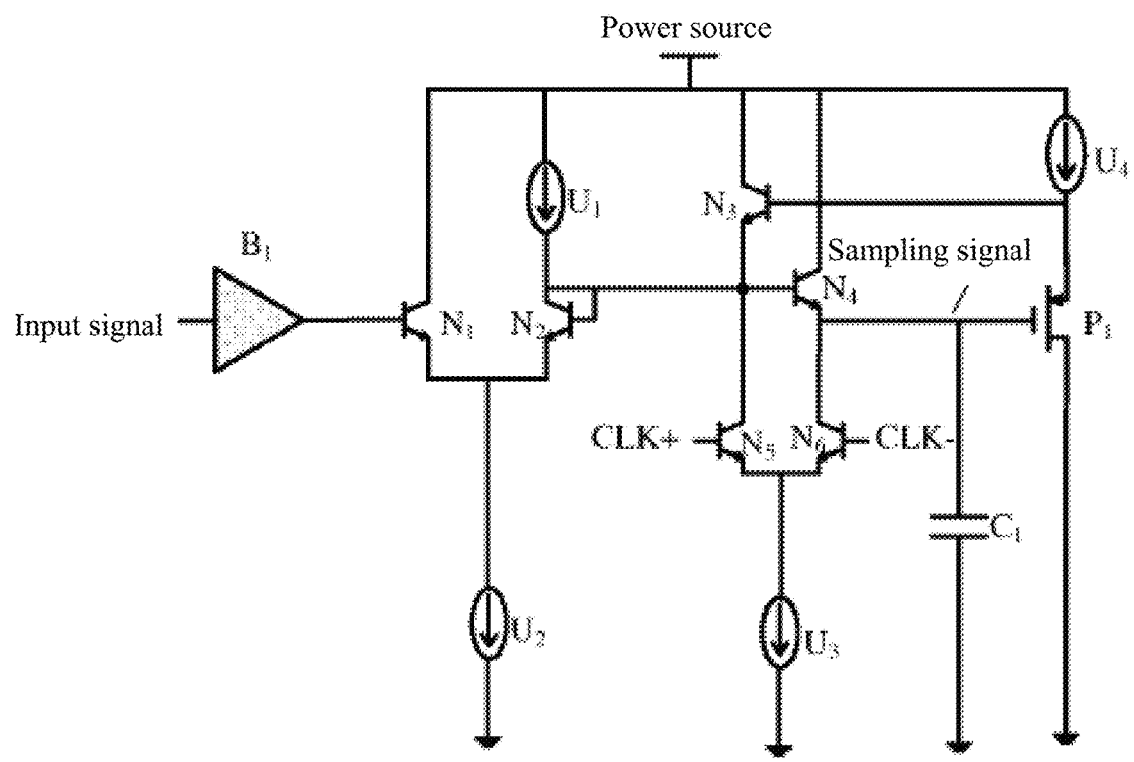
FIG. 3 is a circuit diagram of the second preferred embodiment of the track and hold circuit as shown in FIG. 1.

FIG. 3 is the second preferred embodiment of the present invention. Compared with the first preferred embodiment, the differential pair of the sampling switch $S_1$ in the first preferred embodiment is replaced by a pair of NPN-type triodes $N_5$ and $N_6$ which is controlled by a pair of complementary clock signals CLK+ and CLK− respectively. As the NPN-type triode differential pair features high switching speed, the second preferred embodiment achieves an ultra-high sampling frequency.

Figure 4:
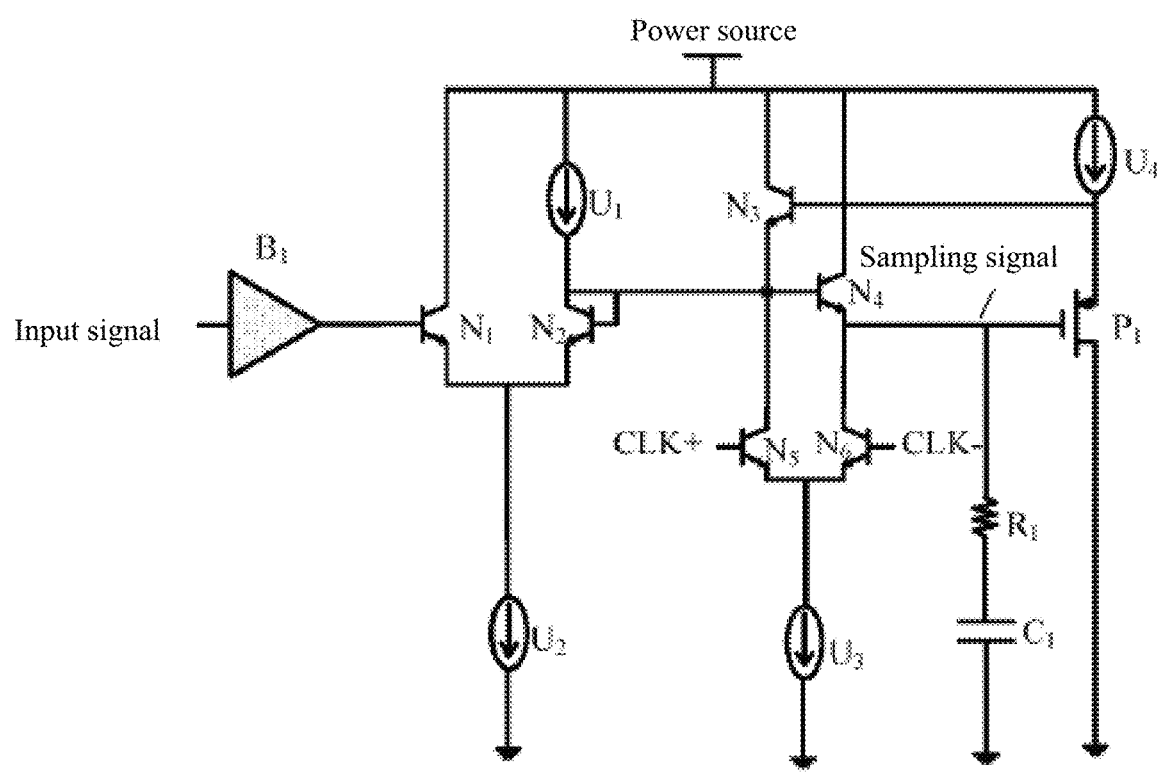
FIG. 4 is a circuit diagram of the third preferred embodiment of the track and hold circuit as shown in FIG. 1.

FIG. 4 is the third preferred embodiment of the present invention. A resistor $R_1$ is added to the circuit. The resistor $R_1$ is connected to the sampling capacitor $C_1$ in series as a low-pass filter, which can effectively filter spurious signals generated from the sampling process.

Figure 5:
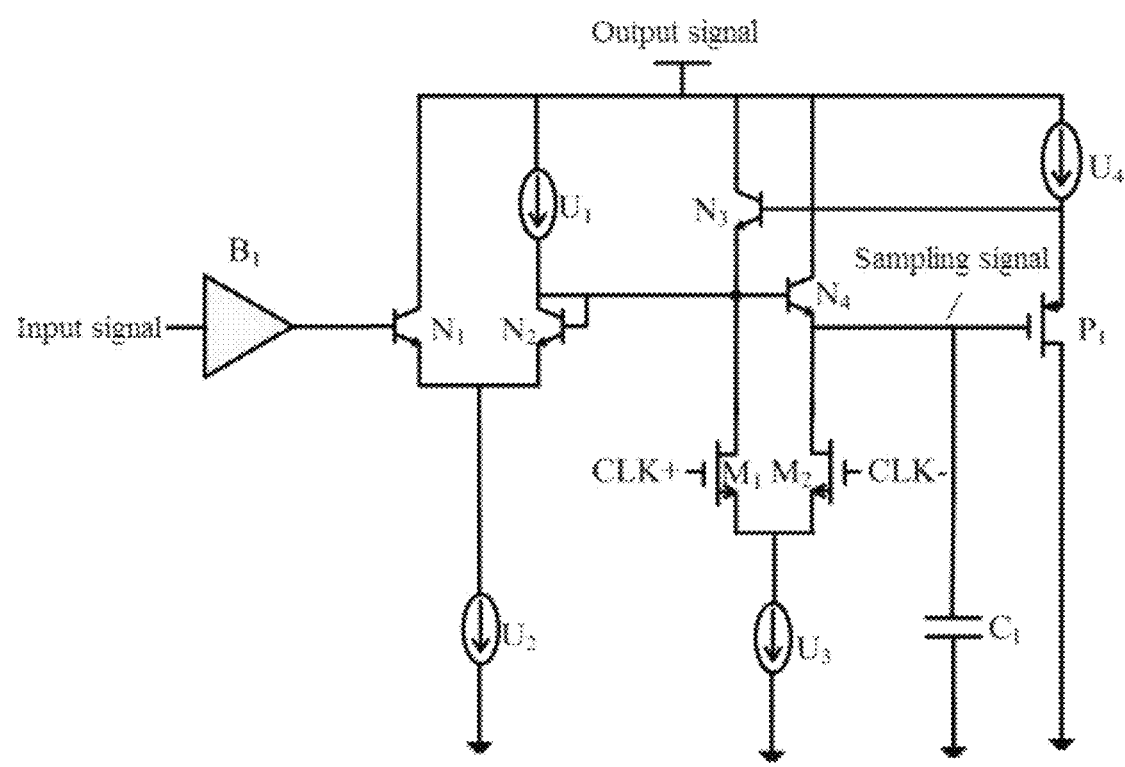
FIG. 5 is a circuit diagram of the fourth preferred embodiment of the track and hold circuit as shown in FIG. 1.

FIG. 5 is the fourth preferred embodiment of the present invention. In the fourth preferred embodiment, it replaces a pair of NPN-type triodes $N_5$ and $N_6$ used in the second preferred embodiment with a pair of N-channel field effect transistors $M_1$ and $M_2$. The differential pair features easier realization in technology and low cost. It can find applications in the circuit not requiring high speed.

The foregoing preferred embodiments are provided to describe, not to limit, technical approaches in the present invention. Obviously, bearing the essence and concept of the present invention, technologists in this field can make various changes and modifications to present invention. It should be understood that those changes and modifications are also covered by claims of the present invention, if they are with the same purpose and within the same scope of the present invention.

What is claimed is:

1. A track and hold circuit, comprising an input buffer amplifier, a unit gain amplifier module, a sampling switch, a drive triode and a sampling capacitor, wherein:

an input buffer amplifier receives an input signal; in track phase, a sampling switch is connected to the emitter of a drive triode; the input signal is buffered through said input buffer amplifier and amplified without distortion by a unit gain amplifier module; and a drive triode is used to charge the sampling capacitor; as the sampling switch shifts from the track phase to the hold phase, said sampling switch is disconnected to the emitter of said drive triode; the base of said sampling switch is connected to that of said drive triode; the base voltage of said drive triode is pulled down till said drive triode is cut off; electrical charges of said sampling capacitor are held, in a way that hold signals on the sampling capacitor, said input buffer amplifier receives, amplifies and outputs input signals; said unit gain amplifier module comprises a first triode, a second triode, a first current source and a second current source, wherein the base of the first triode is connected to the output end of the input buffer amplifier to receive the amplified input signals, the collector of the first triode receives a direct currently (DC) voltage, the emitter of the first triode is connected to the emitter of the second triode to form a differential pair circuit, the emitter of the first triode is connected to the emitter of the second triode, being grounded via the second current source, the base of the second triode is connected to the collector of the second triode to form a feedback circuit; the collector of the second triode receives the DC voltage via the first current source.

2. The track and hold circuit according to claim 1, wherein said first current source works to provide load current for the second triode and said second current source works to provide tail current for the differential pair circuit.

3. The track and hold circuit according to claim 1, wherein said first triode and said second triode are both NPN-type bipolar triodes.

4. The track and hold circuit according to claim 1, wherein the current provided by said second current source is two times of that provided by the first current source.

5. The track and hold circuit according to claim 1, wherein said track and hold circuit comprises a third current source and said sampling switch comprises a first end, a second end and a third end; the first end of said sampling switch is grounded via the third current source; the second end of said sampling switch is connected to the bases of the second triode and the drive triode; the third end of said sampling switch is connected to the emitter of said drive triode; the emitter of said drive triode is grounded via said sampling capacitor; the collector of said drive triode receives DC voltage.

6. The track and hold circuit according to claim 5, wherein said track and hold circuit comprises an overdrive protection module, wherein, said overdrive protection module comprises a field effect transistor, a fourth current source and a third triode; the gate of said field effect transistor is connected to the emitter of said drive triode, the source of said field effect transistor receives DC voltage via the fourth current source; the drain of said field effect transistor is grounded; the base of said third triode is connected to the source of said field effect transistor; the emitter of said third triode is connected to the base of said drive triode; the collector of said third triode receives DC voltage.

7. The track and hold circuit according to claim 6, wherein said field effect transistor is a P-channel field effect transistor and said third triode is an NPN-type triode.

8. The track and hold circuit according to claim 6, wherein said field effect transistor and said fourth current source constitute a source follower circuit, wherein, its input end is connected to the upper plate of said sampling capacitor and its output end is connected to the base of said third triode.

9. The track and hold circuit according to claim 6, wherein said third triode is at OFF state during sample-and-track phase and said third triode stays in the ON state during sample-and-hold phase.

* * * * *